United States Patent [19]
Park et al.

[11] Patent Number: 5,672,230
[45] Date of Patent: Sep. 30, 1997

[54] CENTRAL MANAGEMENT SYSTEM OF WET CHEMICAL STATIONS

[75] Inventors: Heung-soo Park, Seoul; Hee-sun Chae, Suwon, both of Rep. of Korea

[73] Assignee: Samsung Electronics Co., Ltd., Suwon, Rep. of Korea

[21] Appl. No.: 522,958

[22] Filed: Sep. 1, 1995

[30] Foreign Application Priority Data

May 11, 1995 [KR] Rep. of Korea .................. 95-11625

[51] Int. Cl.$^6$ .................................................. B44C 1/00
[52] U.S. Cl. ........................................ 156/345; 134/113
[58] Field of Search ............................... 134/18, 26, 36, 134/56 R, 61, 110, 113; 156/345, 345 M, 345 C, 345 L; 437/228 ST

[56] References Cited

U.S. PATENT DOCUMENTS 5,421,905   6/1995   Ueno et al. ...................... 134/26 X

*Primary Examiner*—William Powell
*Attorney, Agent, or Firm*—Cushman Darby & Cushman, IP Group of Pillsbury Madison & Sutro LLP

[57] ABSTRACT

A central management system for wet chemical cleaning stations includes a number of wet chemical cleaning stations each having a liquid bath, filter, pump and multiple sensors for sensing the process variables thereof; and a main computer connected to the wet chemical cleaning stations to display, store and process data sensed by the sensors and totally manage the data, to thereby enable effective central management of the cleaning process via the main computer.

12 Claims, 2 Drawing Sheets

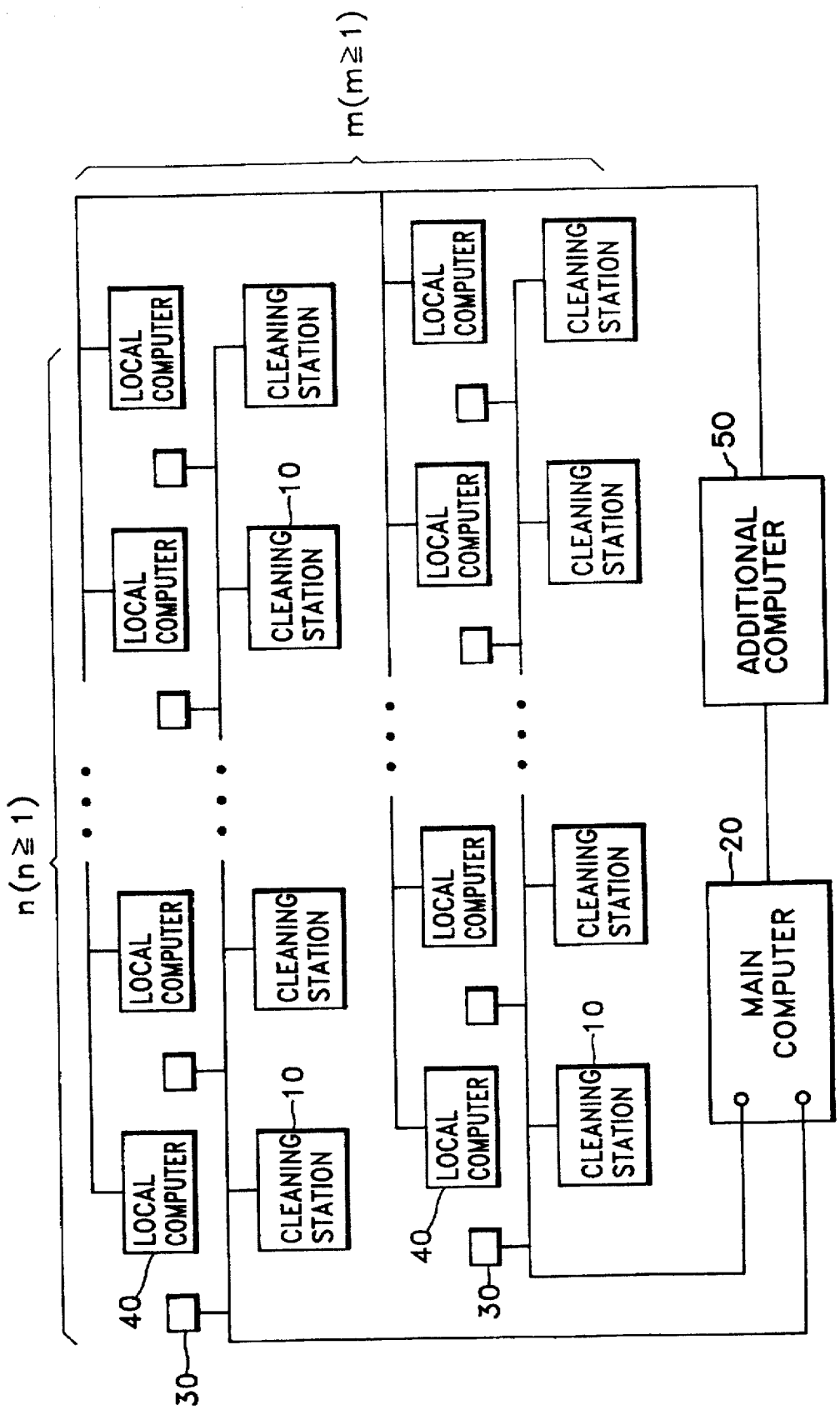

CENTRAL MANAGEMENT SYSTEM OF WET CHEMICAL STATIONS

BACKGROUND OF THE INVENTION

The present invention relates to a cleaning process in a process for manufacturing a semiconductor device and a liquid crystal display. More particularly, the present invention relates to a central management system of wet chemical stations for more effectively managing process variables generated during the cleaning process.

As semiconductor devices have become highly integrated, management criteria for minute forms of contamination, for example, metal particle contamination, have become more strict. The manufacturing process of a semiconductor device requires the efficiency and optimization of the cleaning process.

Selecting and developing a suitable chemical solution including water (hereinafter, all chemical solutions including water will be described as "wet chemical"), determining the appropriate usage temperature and concentration of the wet chemical solution, and suitably selecting and managing the main process variables of a facility, i.e., wet chemical cleaning station, are prerequisites for the efficiency and optimization of the cleaning process. In addition, by considering the processing volume of a wet chemical cleaning station on a mass production line, serious problems can be prevented by identifying an abnormal state early.

However, the main process variables of the wet chemical cleaning station have been managed individually and periodically, not collectively. The periodic and individual management of wet chemical cleaning station (more specifically, a liquid bath), is disclosed in a paper entitled "Adopting a Particle Monitoring Program for Hot-liquid Baths: A Case Study" (see *Microcontamination*, May, 1994, p.37). The study relates to periodically measuring a number of particles in the liquid baths and estimating a time for changing main components of the wet chemical cleaning station, for example, a filter or a pump, with reference to the measured number of particles. However, such a method is ineffective since each piece of the wet chemical cleaning station installed on a mass production line requires periodic and individual management.

SUMMARY OF THE INVENTION

Accordingly, it is an object of the present invention to provide a central management system that effectively manages multiple wet chemical cleaning stations by totally managing the parameters of the wet chemical solution and important variables of the main facilities, for example, a pump or filter, employed by the wet chemical cleaning stations.

To accomplish the above object, there is provided a central management system for a wet chemical cleaning station, comprising: wet chemical cleaning station having a liquid bath, filter, pump and multiple sensors for sensing the process variables thereof; and a main computer connected to the wet chemical cleaning station so as to display, store and process data sensed by the sensors and totally manage the data.

Here, the process variables sensed by the sensor are at least one of the group consisting of the number of particles in a liquid bath, the temperature of the wet chemical in the liquid bath, the differential pressure of a filter, the number of strokes of a pump, the chemical flow rate of a pump, and the pump pressure. It is desirable that the data sensed by the sensor is displayed in real time onto the main computer.

In the meantime, wet chemical cleaning stations can be connected in series, in parallel or in a combination of series and parallel. Each one of the wet chemical cleaning stations may include an alarm that warns if one of the sensed processing variables deviates from a predetermined normal condition. In addition, the main computer can remotely control the sensor's on/off operation.

To accomplish the above object, there is provided another central management system of wet chemical cleaning stations comprising: a wet chemical cleaning station having a liquid bath, a filter, a pump and multiple sensors for sensing the processing variables thereof; multiple local computers individually connected to each wet chemical cleaning station so as to individually manage the data sensed by the sensors; a main computer for displaying, storing and processing the data sensed by the sensors and which is connected to the wet chemical cleaning station and the local computers so as to totally manage the data.

The present invention can further comprise an additional computer connected to the multiple local computers and to the main computer so that central management of a production line for manufacturing a semiconductor device or a liquid crystal display can be possible.

Meanwhile, it is desirable to connect the multiple local computers to a main computer by a local area network. The sensor may comprise an alarm for warning if the sensed process variable deviates from a predetermined scope. It is desirable that the process variables are displayed in real time simultaneously on the main computer and the local computer.

Meanwhile, the local computers can be connected in series, in parallel or in a combination of series and parallel.

The present invention enables effective management of a cleaning process for a semiconductor and a liquid crystal display by means of totally and centrally managing the main process variables of a wet chemical cleaning device via a main computer.

BRIEF DESCRIPTION OF THE DRAWINGS

The above objects and other advantages of the present invention will become more apparent by describing in detail a preferred embodiment thereof with reference to the attached drawings in which:

FIG. 2 is a schematic view of a central management system of a wet chemical cleaning station according to a second embodiment of the present invention.

DETAILED DESCRIPTION OF THE INVENTION

Figure 1:
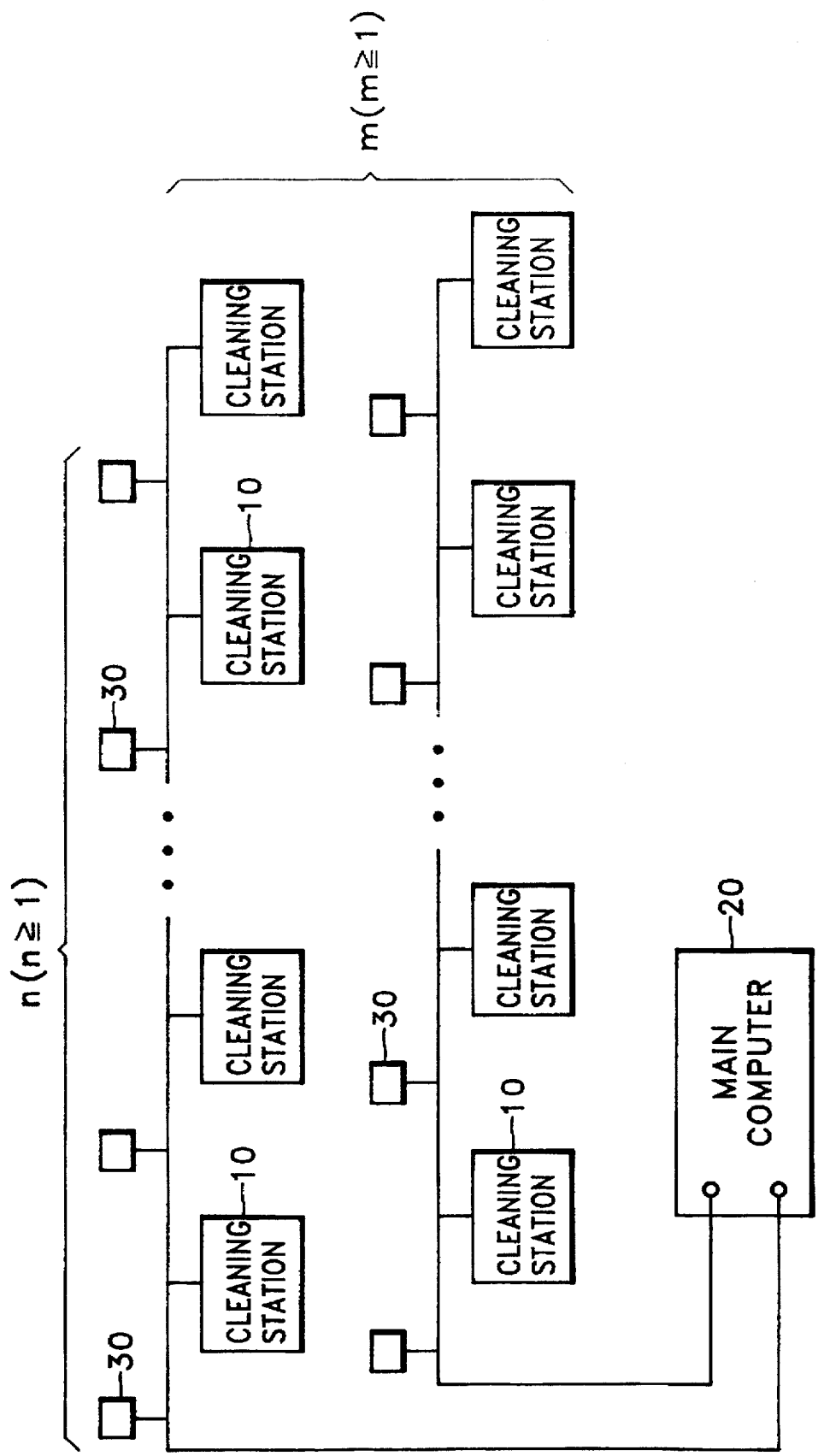
FIG. 1 is a schematic view of a central management system of a wet chemical cleaning station, according to a first embodiment of the present invention.

In FIG. 1, reference numeral 10 denotes wet chemical cleaning stations, employed in the process of cleaning a semiconductor device and liquid crystal display, and associated multiple sensors (not shown), reference numeral 20 denotes a main computer connected to wet chemical cleaning stations 10 so as to display, store and process the data sensed by the sensors of wet chemical cleaning stations 10 and centrally manage the data, and reference numeral 30 denotes alarms connected to wet chemical cleaning stations 10 for generating alarm signals as necessary.

As shown in FIG. 1, n wet chemical cleaning stations 10 can be connected in series or m wet chemical cleaning stations 10 can be connected in parallel, to a port of main computer 20. In addition, wet chemical cleaning stations 10 can be connected in a combination of series and parallel connections. Meanwhile, an alarm can be installed in each wet chemical cleaning station 10 or in a sensor, as necessary.

The sensors installed in wet chemical cleaning stations 10 sense a main process variable that determines the reliability of the cleaning process. The number of particles in a liquid bath, the temperature and density of the liquid, the differential pressure of a filter, the number of strokes in a pump, the chemical flow rate or the pump pressure can be employed as the main process variable.

That is, multiple sensors are installed in wet chemical cleaning stations 10 to measure the main process variables, and the multiple wet chemical cleaning stations installed in a production line for a semiconductor device and liquid crystal display are connected to main computer 20. Accordingly, data with respect to the main process variable in each wet chemical cleaning station and which is sensed by each sensor is transferred to the main computer so as to be centrally managed.

An example of the central management system that can be used in the present invention is one which employs a sensor for counting the number of particles, i.e., a particle counter. When the number of particles in the liquid bath surpasses a predetermined level, the reliability of the cleaning process is lowered and a poorly manufactured semiconductor device can result.

The particle counter is installed in the liquid bath to sense light scattered by the particles in the liquid bath and thereby count the number of particles. Then, the sensed number of particles is converted into an electrical signal and transferred to main computer 20. Thus, data representing the number of particles in wet chemical cleaning stations 10 is displayed in real time, stored and processed in main computer 20. Here, if necessary, alarms 30 connected to wet chemical cleaning stations 10 can be employed to warn of the case where the sensed number of particles is beyond a process limit. In addition, main computer 20 can remotely control the on/off operation of the sensor.

According to the above-mentioned method, the number of particles in the liquid bath of each wet chemical cleaning station 10 employed in the semiconductor and liquid crystal display manufacturing process can be managed by main computer 20. Thus, multiple wet chemical cleaning stations 10 can be managed effectively and simultaneously.

According to a first embodiment of the present invention, the liquid employed for each wet chemical cleaning station 10 and the main process variables of the system, for example, a pump or a filter, are totally and centrally managed via main computer 20. Thus, multiple wet chemical cleaning stations 10 installed on a production line for manufacturing a semiconductor device and a liquid crystal display can be managed effectively.

FIG. 2 is a schematic view showing a central management system for multiple wet chemical cleaning stations arranged in accordance with a second embodiment of the present invention. The second embodiment is the same as the first embodiment, except that multiple local computers 10 are installed to individually manage each wet chemical cleaning station 10. In FIG. 2, the same reference numerals as those of FIG. 1 denote like elements.

In FIG. 2, reference numeral 10 denotes multiple wet chemical cleaning stations used for cleaning a semiconductor device and liquid crystal display, and associated multiple sensors. Reference numeral 20 denotes a main computer connected to each of the wet chemical cleaning stations 10 to display, store and process the data sensed by the sensors associated with the wet chemical cleaning stations and to centrally manage the data. Reference numeral 30 denotes an alarm connected to each of the wet chemical cleaning stations 10 to generate an alarm signal, when necessary. Reference numeral 40 denotes local computers associated with the wet chemical cleaning stations 10 for individually monitoring in each wet chemical cleaning station 10.

There can be n local computers 40 connected in series or m local computers 40 connected in parallel. In addition, local computers 40 can be connected in a combination of series and parallel connections. Here, it is desirable that local computers 40 and main computer 20 are connected by a local area network.

Meanwhile, in addition to the local computers connected to each wet chemical cleaning station, an additional computer 50 can be installed in the production line to facilitate remote management of wet chemical cleaning stations 10. Here, main computer 20 is installed remotely, for example, in an office removed from the production line.

According to the second embodiment of the present invention, the main process variables of wet chemical cleaning stations 10 are totally and centrally managed via main computer 20, to thereby enable the effective management of a process for cleaning a semiconductor device and a liquid crystal display.

The wet chemical cleaning stations used in the present invention can be of the type manufactured by Dai Nippon Screen of Japan, for example, model number SWS 625. The computers, as will be readily recognized by those skilled in the art, can be basic 486 personal computeres or equivalents thereto. The sensors and alarms can be of the type manufactured by Particle Measuring Systems, Inc. of the U.S., for example, model numbers 7000 and EA-LAN, respectively.

It is further understood by those skilled in the art that the foregoing description is a preferred embodiment of the disclosed system and that various changes and modifications may be made in the invention without departing from the spirit and scope thereof.

What is claimed is:

1. A central management system for wet chemical cleaning stations, comprising:
   a plurality of wet chemical cleaning stations each having a liquid bath, filter, pump and at least one sensor for sensing a process variable thereof; and
   a main computer connected to said plurality of wet chemical cleaning stations for displaying, storing and processing data sensed by any one of said at least one sensor and totally managing said data.

2. A central management system for wet chemical cleaning stations according to claim 1, wherein said process variable sensed by any of said at least one sensor is at least one selected from the group consisting of: number of particles in said liquid bath, temperature of the liquid in said liquid bath, density of the liquid in said liquid bath, differential pressure of a filter, number of strokes of a pump, chemical flow rate and pump pressure.

3. A central management system for wet chemical cleaning stations according to claim 1, wherein said sensed data is displayed in real time by said main computer.

4. A central management system for wet chemical cleaning stations according to claim 1, wherein said plurality of wet chemical cleaning stations are connected in any one of series, parallel or a combination of series and parallel.

5. A central management system for wet chemical cleaning stations according to claim 1, wherein each one of said plurality of wet chemical cleaning stations comprises an alarm for warning if said sensed process variable has a value which deviates from a normal value.

6. A central management system for wet chemical cleaning station according to claim 1, wherein said at least one sensor can be remotely controlled to be turned on/off by said main computer.

7. A central management system for wet chemical cleaning stations, comprising:

a plurality of wet chemical cleaning stations each having a liquid bath, a filter, a pump and multiple sensors for sensing processing variables thereof;

multiple local computers individually connected to each of said plurality of wet chemical cleaning stations to individually manage the data sensed by said multiple sensors; and a main computer for displaying, storing and processing the data sensed by said multiple sensors, said main computers being connected to said plurality of wet chemical cleaning stations and to said multiple local computers for totally managing said data.

8. A central management system for wet chemical cleaning stations according to claim 7, further comprising an additional computer connected to said multiple local computers and to said main computer, to enable central management of a production line for producing semiconductor devices and a production line for producing liquid crystal devices.

9. A central management system for wet chemical cleaning stations according to claim 7, wherein said multiple local computers and said main computer are connected by a local area network.

10. A central management system for wet chemical cleaning stations according to claim 7, wherein each of said multiple sensors comprise an alarm for warning if said sensed process variable deviates from a natural value.

11. A central management system for wet chemical cleaning stations according to claim 7, wherein said sensed process variable is displayed by said main computer and by said multiple local computers, in real time.

12. A central management system for wet chemical cleaning stations according to claim 7, wherein said multiple local computers are connected in any one of series, parallel and a combination of series and parallel.

* * * * *